(12) United States Patent
Scheiner

(10) Patent No.: US 8,531,679 B2
(45) Date of Patent: Sep. 10, 2013

(54) OPTICAL SYSTEM AND METHOD FOR MEASUREMENT OF ONE OR MORE PARAMETERS OF VIA-HOLES

(75) Inventor: David Scheiner, Ganei Yehuda (IL)

(73) Assignee: Nova Measuring Instruments Ltd., Weizmann Science Park, Rehovot (IL)

( * ) Notice: Subject to any disclaimer, the term of this patent is extended or adjusted under 35 U.S.C. 154(b) by 14 days.

(21) Appl. No.: 12/746,528

(22) PCT Filed: Dec. 10, 2008

(86) PCT No.: PCT/IL2008/001599
§ 371 (c)(1),
(2), (4) Date: Jun. 7, 2010

(87) PCT Pub. No.: WO2009/074984
PCT Pub. Date: Jun. 18, 2009

(65) Prior Publication Data
US 2010/0284027 A1 Nov. 11, 2010

(30) Foreign Application Priority Data
Dec. 10, 2007 (IL) .......................................... 188029

(51) Int. Cl.
*G01B 11/00* (2006.01)
(52) U.S. Cl.
USPC .............................. 356/626; 356/614; 356/445
(58) Field of Classification Search
USPC ...................... 356/614–636, 445; 250/559.42, 250/559.43, 559.45, 341.4, 306, 307; 438/629, 438/639, 14, 16, 18
See application file for complete search history.

(56) References Cited

U.S. PATENT DOCUMENTS

| | | | |
|---|---|---|---|
| 5,015,097 A * | 5/1991 | Nomoto et al. ................ | 356/314 |
| 5,048,968 A | 9/1991 | Suzuki | |
| 5,208,648 A | 5/1993 | Batchelder et al. | |
| 6,137,570 A * | 10/2000 | Chuang et al. .............. | 356/237.5 |
| 6,486,965 B1 * | 11/2002 | Kim .............................. | 356/626 |
| 6,489,624 B1 * | 12/2002 | Ushio et al. .............. | 250/559.27 |
| 6,690,024 B1 | 2/2004 | Funaoka et al. | |
| 6,720,248 B2 * | 4/2004 | Ryo .............................. | 438/622 |
| 6,946,857 B2 * | 9/2005 | Yamada et al. .......... | 324/754.22 |
| 6,971,791 B2 * | 12/2005 | Borden et al. .................... | 374/5 |
| 7,379,185 B2 * | 5/2008 | Borden et al. ................ | 356/445 |
| 8,062,970 B2 * | 11/2011 | Tanaka .......................... | 438/629 |

(Continued)

OTHER PUBLICATIONS

Search Report of WO/2012/098550.

*Primary Examiner* — Sang Nguyen
(74) *Attorney, Agent, or Firm* — Daniel J. Swirsky; AlphaPatent Associates Ltd.

(57) ABSTRACT

The present invention provides a novel system and method for obtaining at least one of a cross-section profile, depth, width, slope, undercut and other parameters of via-holes by non-destructive technique. The optical system comprises an illumination system for producing at least one light beam and directing it on a sample in a region of the structure containing at least one via-hole; a detection system configured and operable to collect a pattern of light reflected from the illuminated region, the light pattern being indicative of one or more parameters of said via-hole; and, a control system connected to the detection system, the control system comprising a memory utility for storing a predetermined theoretical model comprising data representative of a set of parameters describing via-holes reflected pattern, and a data processing and analyzing utility configured and operable to receive and analyze image data indicative of the detected light pattern and determine one or more parameters of said via-hole.

28 Claims, 11 Drawing Sheets

(56) References Cited

U.S. PATENT DOCUMENTS

| | | |
|---|---|---|
| 2003/0053059 A1 | 3/2003 | Mishima et al. |
| 2003/0223087 A1 | 12/2003 | Sasazawa et al. |
| 2005/0057755 A1 | 3/2005 | Johnson et al. |
| 2005/0125184 A1 | 6/2005 | Ye et al. |
| 2006/0132806 A1 | 6/2006 | Shchegrov et al. |
| 2008/0055609 A1 | 3/2008 | Finarov et al. |

* cited by examiner

SWA = -1deg            AR = 7            SWA = +1deg

OPTICAL SYSTEM AND METHOD FOR MEASUREMENT OF ONE OR MORE PARAMETERS OF VIA-HOLES

CROSS-REFERENCE TO RELATED APPLICATIONS

This application is a U.S. National Phase Application under 35 U.S.C. 371 of PCT International Application No. PCT/IL2008/001599, which has an international filing date of Dec. 10, 2008, and which claims benefit from Israel Patent Application No. 188029, filed Dec. 10, 2007, the contents of which are herein incorporated by reference in their entirety.

FIELD OF THE INVENTION

This invention relates to the field of measurement techniques, and particularly to an optical system and method for measurement of parameters of so-called Through-Silicon Vias (TSV).

BACKGROUND OF THE INVENTION

Packaging technology for Integrated Circuits (IC) in the semiconductor industry undergoes increased development in order to satisfy a need for miniaturization and/or mounting reliability. Wafer level processing (WLP) techniques have been developed to allow various features of IC packages to be formed within a wafer before the wafer is diced. For instance, certain WLP techniques are used to form device interconnection features together with other wafer processing steps, thereby avoiding the need to form wire bonding after IC chips are diced.

In general, such WLP techniques allow IC package manufacturing processes to be streamlined and consolidated. Moreover, WLP techniques can generally be performed in parallel on a plurality of IC chips arranged in a matrix on the wafer, thereby allowing a plurality of IC chips to be formed and tested while still in a wafer stage. By performing WLP techniques in parallel across a plurality of IC chips, IC package manufacturing throughput is increased and the total time and cost required to fabricate and test IC packages is decreased accordingly. In addition, by forming features such as device interconnections at the wafer level, the overall size of IC packages can be reduced.

One of the WLP techniques used to form device interconnections involves the formation of a through silicon via. A through silicon via (TSV) is usually formed by creating a hole (via-hole) through a semiconductor substrate and/or various material layers formed on the substrate, and then forming a penetration electrode in the hole. The penetration electrode may be connected to internal features of an IC chip such as signal terminals, data transmission lines, transistors, buffers, and so on. In addition, the penetration electrode may be connected to features external to the IC chip, such as a PCB, via an external terminal.

Depending on the type of process in use, via-holes could be formed in different layered stacks of materials in wafers and other substrates. The holes are typically formed by etching based on Reactive Ion Etching (RIE) or laser drilling by ablation. The ion etching can be performed by a variety of processes optimized for materials, etch rate, sidewall slope, smoothness and other parameters. A well known method of etching is the Bosch method which is based on alternating steps of semi-isotropic etching and deposition.

In the so-called "via-first approach", the holes are first formed in silicon, by etching using an etch mask and photo-resist and/or other harder mask materials. The mask materials layers are relatively thin layers on thick silicon. If the via-holes are formed by laser-drilling, no etch mask material is used, the holes being formed only in the thick silicon. Via-hole diameters can range from the one micron scale up to tens of microns, with depth to diameter aspect-ratios going from 5 or less up to 30 or more. The minimum pitch that can be implemented between the holes is a critical parameter for minimizing the distance that electrical signals have to cover between the vertically stacked ICs. The minimum pitch is usually a small multiple of the minimum hole diameter.

In the so-called "via-last approach", the holes are formed in the wafer backside through the silicon, until coming up to the conductive material on the wafer frontside. In this case, in addition to the possible etch mask materials on the silicon as in the via-first, the bottom of the hole (i.e. near to the wafer frontside) is formed in a different, possibly conducting, material such as copper. The layered stack can thus include possible masking layers, silicon sidewalls and a conductive bottom.

An additional option for the via-last approach is based on etching or laser drilling through the full stack of materials on the wafer frontside including dielectric insulating materials. The bottom of the hole is deep in the silicon substrate. The layered stack can include in this case, possible masking layers, sidewalls of various dielectric materials, sidewalls of silicon and bottom of silicon. In via-last, the holes are usually formed with dimensions and pitch (e.g. tens of microns) larger than in the via-first, usually targeted to be connected with the underside of previously formed copper pads on the front surface of the wafer.

GENERAL DESCRIPTION

The present invention provides a novel optical system and method for obtaining at least one of a cross-section profile, depth, width, slope, undercut and other parameters of via-holes by non-destructive technique. It should be understood that to control etch processes and subsequent coating processes, via-holes profile has to be determined. For example, controlling the depth of the holes is critical for reaching a correct vertical location. The ability to effectively coat the inside of the holes, usually with barrier layers, and subsequently fill them with a conductive material, depends on the geometrical profile of the holes.

To control the profile cross-section of the holes, a physically destructive cleavage or etch is usually performed. The cross-section is then exposed to imaging by optical-microscope, scanning-electron-microscope or scanning-ion-microscope.

The present invention enables determining one or more parameters of at least one via-hole in a structure by providing an optical system comprising inter alia an illumination system for producing at least one light beam and directing it on a sample in a region of the structure containing at least one via-hole. The light reflected from the via-hole (or holes), is collected by a detection system comprising a detector. The detection system is configured and operable to collect a pattern of light reflected from the illuminated region, the light pattern being indicative of one or more parameters of the via-hole. The pattern of the reflected light incident on the detector is analyzed by a control system connected to the detection system and one or more parameters of the hole(s) are found. The control system comprises a memory utility for storing a predetermined theoretical model comprising data representative of a set of parameters describing via-holes reflected pattern, and a data processing and analyzing utility configured and operable to receive and analyze image data indicative of the detected light pattern and determine one or more parameters of the via-hole. It should be noted that all the subsequent description relating to the measurement of a single hole is applicable to multiple holes whether placed in arbitrary locations or in a repetitive array structure.

In some embodiments, the detection system comprises a light sensitive surface located in a far field relation or in a Fourier relation with respect to a sample surface.

It should be understood that the incident light beam on the sample undergoes different reflections in the hole depending on at least some of the following parameters: the incident-beam's tilt from normal, hole opening shape, aspect-ratio, sidewall slope, sidewall slope variation, bottom rounding, surface roughness, surface absorption, surface coating etc.

The light pattern reflected from the sidewalls effectively describes the shape and parameters of the sidewalls and enables their analysis. For example, if the bottom of the hole has a high degree of rounding, the light beam reflected from the bottom effectively spreads into a two-dimensional fan which can probe the sidewalls, even when the incident beam is normal to the surface of the sample. If the bottom of the hole is essentially flat, controlled tilt of the incident beam is required to obtain information on the sidewalls.

In some embodiments, the illumination system comprises a plurality of light sources. The light sources may emit at different angles of incidence on a sample surface, the detection system collecting a plurality of light patterns corresponding to different angular positions. At least two of the plurality of light sources can produce light beams at different wavelengths.

The illumination system may comprise a light source associated with an aperture configured to shape the angle incident on a sample surface.

In some embodiments, the illumination system comprises an array of LEDs or lasers.

The illumination system may comprise an objective lens configured to focus a plurality of beams on the sample, the array being located in the back-focal plane of the objective lens, the back-focal plane having a Fourier relation or a far field relation with the sample surface plane. The array may also be located at a plane having a Fourier relationship or far field relationship with the sample surface plane. The array may be imaged to a plane having a Fourier relationship or far field relationship with the sample surface plane. The array may be arranged in a grid-like pattern.

The one or more parameters of the via-holes may be selected from the followings: geometrical profile, cross-section profile, depth, width, slope, undercut, hole opening shape, aspect-ratio, sidewall slope, sidewall slope variation, bottom rounding, surface roughness, surface absorption, surface coating of the via-holes.

In some embodiments, the system is configured and operable for determining parameters of multiple holes distributed in a sample in arbitrary locations or in a repetitive array arrangement.

The detection system may comprise a lens configured to collect the pattern of the reflected light and to image the pattern onto the detector.

The system may comprise at least one of polarizer or spatial filter configured to block a portion of the light pattern reflected from the region surrounding the via-hole.

According to another broad aspect of the present invention, there is provided a method for determining parameters of at least one via-hole. The method comprises providing data indicative of an initial theoretical profile of at least one via-hole having a set of parameters and a model image based on the theoretical profile; the set of parameters describing via-holes reflected pattern and being based on morphological characteristics of an image of a sample to be analyzed; illuminating a region of a sample containing at least one via-hole; collecting a pattern of light reflected from the region and being indicative of one or more parameters of the via-hole; receiving and comparing an image data indicative of the detected light pattern and the model image and determining at least one parameter of the via-hole in the sample.

In some embodiments, the method comprises determining a degree of correlation between the image data indicative of the detected light pattern and the model image and when the degree of correlation is beyond a predefined range, generating as new set of parameters based on the differences between the images.

The method may comprise varying at least one illuminating parameter and collecting a plurality of patterns of reflected light corresponding to the variation and comparing each image data indicative of the detected light patterns with a corresponding model image. The illumination parameter(s) is/are selected from the followings: angle of incidence of a light beam on the sample surface, wavelength of incident light beam, divergence angle of incident light beam, rotation angle between an illumination source illuminating the region of the sample and the sample surface, polarization of the incident light beam.

The method may comprise varying the angle of incidence of the light beam on the sample surface and detecting the reflected light pattern as function of different incident angles, being indicative of the morphology of the shape of the hole.

In other embodiments, the method comprises varying the divergence angle of incident light beam and detecting the reflected light pattern as function of different divergence angles, varying the resolution of the reflected light patterns and the accuracy of the parameters of the via-holes.

In other embodiments, the method comprises varying the wavelength of incident light beam and detecting the reflected light pattern as function of different wavelengths, being indicative of the depth and the pitch of scalloping profile of the walls' hole.

The parameters of the theoretical profile may be selected from at least one of the following parameters: hole opening shape, aspect-ratio, sidewall slope, sidewall slope variation, bottom rounding, surface roughness, surface absorption, surface coating.

The method may comprise rotating the plane of incidence of the light beam in relation with the plane of the sample surface by rotating at least one of a sample, a light source and an aperture located in front of the light source and a polarizer.

The method may comprise characterizing thickness distribution and geometrical profile of a coating layer deposited in the via-hole by performing measurements before and after the coating, and by analyzing the differences between the measurements.

In some embodiments, the method comprises segmenting the image data indicative of the detected light pattern into different profiles using the morphological characteristics of the image. The morphological characteristics are selected from symmetry of the image in relation to at least one incidence angle, narrow-angle spread of reflection angles around the incident angle indicative of side-wall angles, number of rings in the reflected pattern of light indicative of the aspect ratio of the hole, portion of the reflected pattern of light at high angles indicative of a slight bottom rounding, reduced or hazy light pattern as indicator of surface roughness.

The method may comprise collecting a pattern of light scattered from the region and analyzing an image data indicative of the scattered light pattern indicative of the shape and the aspect ratio of the holes.

BRIEF DESCRIPTION OF THE DRAWINGS

In order to understand the invention and to see how it may be carried out in practice, embodiments will now be described, by way of non-limiting example only, with reference to the accompanying drawings, in which.

DETAILED DESCRIPTION OF EMBODIMENTS

Figure 1A:
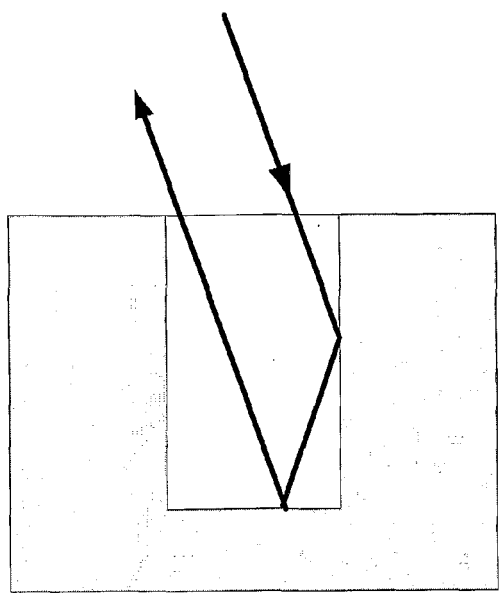
FIG. 1 schematically represents the reflection of a light beam from via-hole before (1A) and after coating (1B)
Figure 1B:
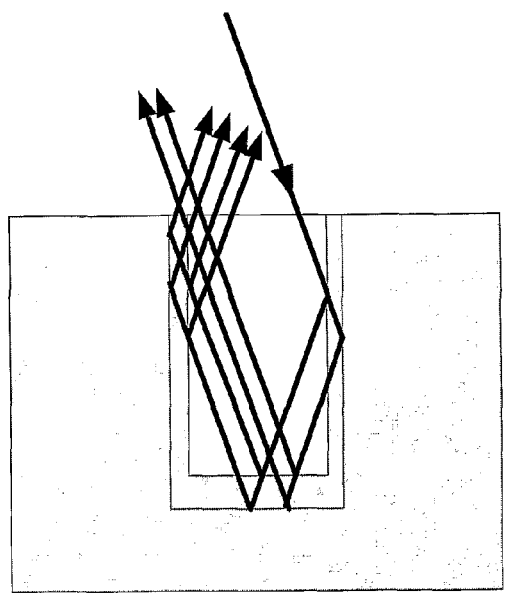

Reference is made to FIGS. 1A-1B illustrating an example how the principles of the invention can be used for analyzing the hole profile. In this specific example, the reflection of a light beam from a via-hole before (1A) and after coating (1B) is shown, which can be made with diffusion-barrier, insulating or conducting material layer (e.g. semi-transparent). The present invention enables measuring the thickness and profile of such coating layers. For non-transparent coating layers, their thickness distribution can be characterized by performing measurements before and after the coating step, and by analyzing the difference between the measurements. For transparent coating layers, their thickness distribution can be characterized similarly, analyzing the difference between the measurements, or by a single measurement after the coating step. It should be noted that, in certain cases, especially with complex structures, the measurement results from the pre-coating step can be set into the analysis calculation of the post-coating measurement in order to simplify the calculations or increase the accuracy of the results.

Figure 2A:
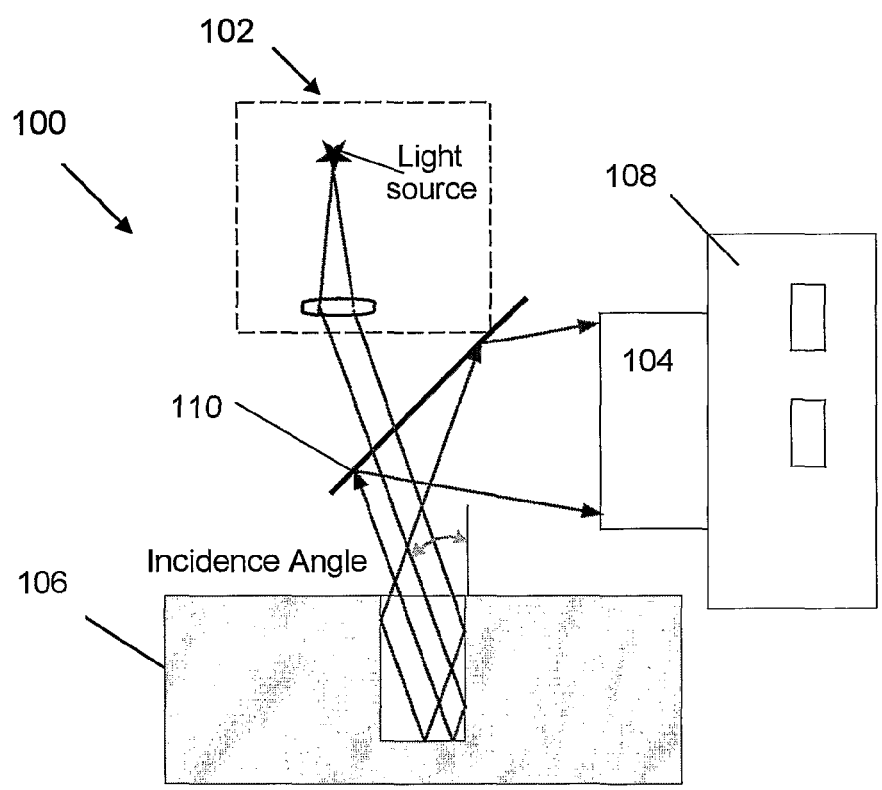
FIGS. 2A-2B schematically represents two examples of the configuration of the optical system of the present invention.

Reference is made to FIG. 2A generally illustrating the optical system 100 of the present invention. The optical system 100 comprises an illumination system 102 emitting a light beam on a sample 106 in a region containing at least one hole. The light pattern reflected from the hole (or holes), is collected on a detector 104 (e.g. area detector located in a far field relation to the sample surface). The optical paths of incident and reflected light beams are spatially separated by a beam splitter/combiner 110, thus allowing the reflected light propagation to the detector. The output of the detector 104 is connected to a control unit 108, which is configured and operable for receiving data indicative of the pattern of the reflected light incident on the detector 104 and analyzing the data and determining the parameters of the hole(s).

The incident light beam on the sample undergoes different reflections from interfaces in the hole depending on at least some of the following parameters: the incident-beam's tilt from normal, hole opening shape, aspect-ratio, sidewall slope, sidewall slope variation, bottom rounding, surface roughness, surface absorption, surface coating etc. In some embodiments, to enable the analysis of at least one of the parameters of the via-holes, measurements have to be performed by varying at least one parameter of the above list, and the difference between the measurements is used to determine the value of at least one corresponding parameter.

In one embodiment, the angle of the incident light beam is varied and the measurements are performed at different angles. The illumination system 102 may comprise multiple light sources (e.g. small-area sources) at various off-axis angles enhancing parameter sensitivity and/or simplifying the analysis. The range of off-axis angles for obtaining optimal information content depends on the shape of the hole and especially on the aspect-ratio of the hole. The larger the tilt from normal incidence, the larger the number of reflections the light rays undergo within the structure.

The multiple light sources can be operable simultaneously or separately. The multiple light sources can be of the same wavelength or of different wavelengths. For example, in order to collect the information from different angles simultaneously, the illumination system may comprise multiple light sources of different colors associated with a color CCD camera.

The shaping of the incidence angles on the sample may also be produced by a large area source associated with an aperture. This aperture can be static, scanned or switchable. The light source can thus be scanned through a range of angles, and a series of images can be captured at successive angular positions. This configuration can be useful inter alia if the examined structure has sharp angular variations in wall angle, especially re-entrant profiles, resulting in sharp variations in the reflected light pattern versus the incidence angle. Alternatively, the scanning can be achieved by using an extended wide-band light source, placing a spatially graded spectral filter in front of it, and capturing images through a time variable spectral filter, such as a filter wheel, synchronized with image capture on the detector.

The illumination system 102 can also be implemented by an array of small sources e.g. an individually addressable Light Emitting Diode (LED) array, illuminating a relatively large region of the structure. For simplifying the determination of the parameters of the via-holes, such array can be placed in a plane having a far-field or Fourier relation to the sample surface and conjugates with the light sensitive detector surface.

Figure 2B:
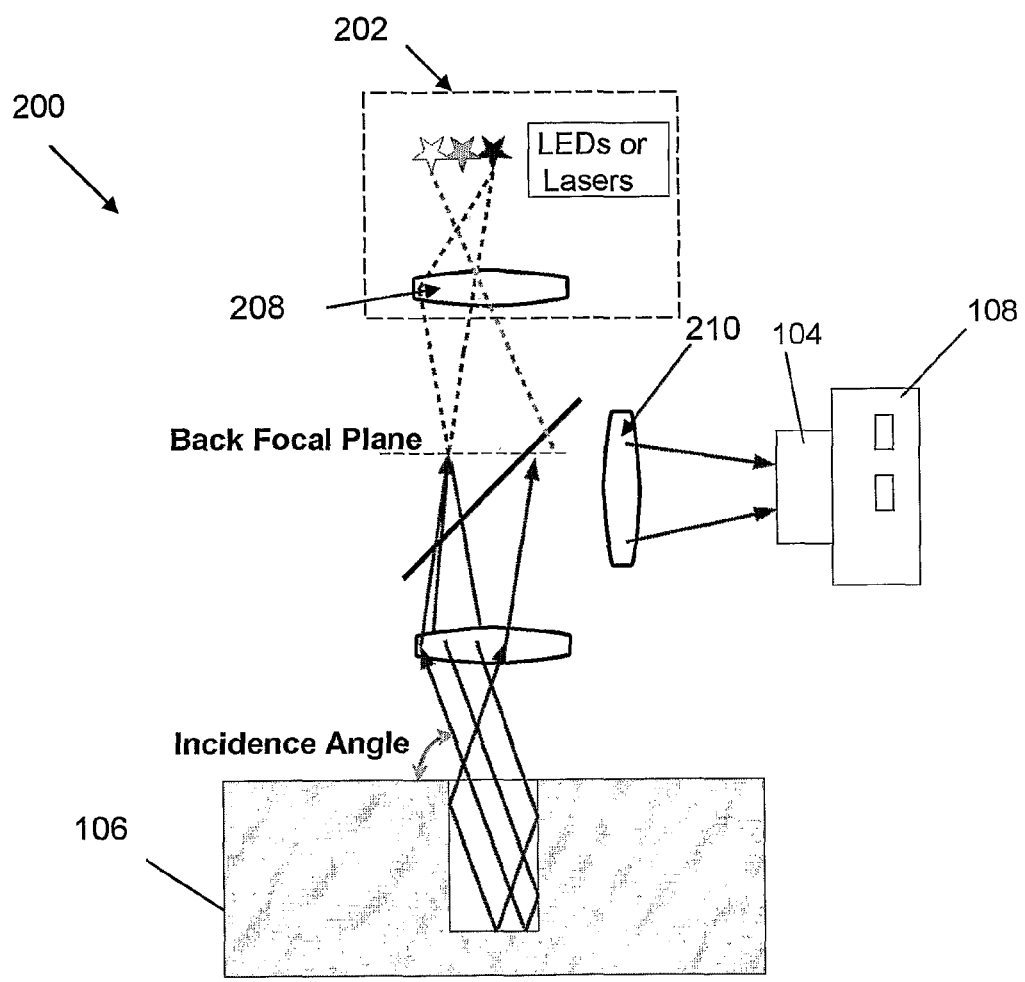

Reference is made to FIG. 2B, illustrating another configuration of the optical system of the present invention. In this specific example, the optical system 200 comprises a illumination system 202 including an array of light sources (LEDs or lasers) located in a back-focal plane of an objective lens 208 focused on the sample 106, where the back-focal plane exhibits a Fourier relation with the sample plane. The array can also be located at a plane which is imaged onto a plane with a Fourier relationship with the sample. LEDs of different wavelengths can be arranged in a grid-like pattern to provide degrees of freedom in setting up a measurement with an optimal incidence angle and wavelength for each hole shape.

The density of the array is operable to enable sufficient angular resolution of the measurement based on the required resolution of the calculated theoretical model.

The divergence angle of the incident beam on the sample can also be varied. A relatively small divergence angle can result in sharper, more distinguishable features on the detector to the detriment of reduced light pattern intensity and thus increased measurement integration time. A larger divergence angle reduces the measurement time but can degrade the resolution of features in the image on the detector and thus reduce the ability to accurately differentiate parameters of the hole profile. The divergence angle can be optimized during the measurement set-up process by varying the divergence angle to the largest possible where the resolution in the image is limited by small scale scattering effects and/or the resolution of the optical system.

As described above, the detector 104 is located in the optical system 100 at a position which enables capturing the light pattern reflected and scattered from the sample surface. The detector 104 can be placed at a distance from the sample in order to capture a far-field image of the light pattern. Alternatively, an optical element can be placed in front of the detector 104 to enable more flexibility in locating the detector. This can preferably enable construction of a better optimized or more compact optical system.

A lens 210 can be used to collect the reflected light pattern and image it onto the light sensitive surface of the detector 104. Optionally the lens may be configured so that the image on the detector is of a Fourier relation to the sample.

In some embodiments, a polarizer can be located in the optical path before or after the light beam interaction with the sample. A polarizing beam splitter/combiner can be used. Alternatively, two crossed polarizers can be located in the optical path before and after the sample to enable blocking of the light pattern reflected directly from the region of the structure surrounding the hole.

In other embodiments, the plane of incidence can be rotated in relation to the axis of the sample (azimuth). For non-circular holes, e.g. holes with rectangular openings, the rotated plane of incidence can be used to obtain information on the via-hole(s) shape. The rotation can be achieved by rotating the sample, and/or the source and/or an aperture in front of the source. The rotation can be combined with possible rotation of a polarizer(s). For holes having a substantially circular opening, the rotated plane of incidence can be used if the holes are closely spaced in a grid-like arrangement and the orientation of the diffraction pattern of the holes arrangement can give additional information for the analysis.

In some embodiments, a spatial filter (e.g. field stop) is included in the optical path at a position which is optically conjugated to the sample surface to enable limiting the lateral extent of the measured light beam interaction with the sample, the spatial filter being located either in the incident beam path or in the optical path between the sample and the detector.

In some embodiments, an additional imaging detector can be added to the optical system at a location conjugate to the plane of the sample surface to enable verification of the measurement location. For example, a CCD camera can be added to provide an image of the sample surface to enable alignment on a preferred measurement site by means of pattern recognition. The illumination for the pattern recognition can be performed by separate means or by utilizing the incident light beam used for the hole measurements.

Due to the large scale size of the hole dimension (diameter), e.g. multi-micron range, with respect to the wavelength of the light beam, the incident light beam can be incoherent. This depends on the coherence length of the light source used and the numerical aperture and other parameters of the illumination system. A system using incoherent illumination is not sensitive to the arrangement of holes whether in a random or in a grid-like pattern and is not subject to speckle effects. Low coherence or to incoherence can simplify the modeling of the reflection from the sample due to the absence of interference effects.

On the other hand, coherence can provide additional information on the structure due to such interference effects. Additionally, using a highly collimated light source with small extent in the Fourier-plane or far-field relation, reduces the possible smearing of the reflection pattern.

Moreover, the reflected pattern of an incoherent beam, with wavelength considerably smaller than the measured structure, provides only angle-based information, which is scale invariant, thus enabling the determination of the shape of the hole but not of its absolute size.

If the lateral coherence length is larger than the diameter of the hole and/or the longitudinal coherence length is larger than the depth of the hole, then the reflected pattern can contain diffraction and interference effects. Based on knowledge of the wavelength and materials of the structure, these effects can enable determination of absolute geometrical values and not just relative ones.

If the illumination system produces at least two incoherent light beams at different wavelengths (e.g. using at least two different light sources), the pattern of the reflected light collected from each wavelength does not provide any additional information, except for the wavelength dispersion of reflectivity. When coherence effects appear, they are stronger for longer wavelengths of dimensions closer to the dimensions of the hole. To reduce the effect of the coherence on the reflection pattern, a light source with broader wavelength range can be used. A wideband coherent light source such as a super continuum light source (e.g. fiber-laser) can also be used if high intensity is required.

Alternatively or additionally, in the absence of absolute hole size information in the reflected pattern, an additional channel can be implemented as part of the system to measure the width of the opening of the hole, for example using a high magnification imaging channel. Thus the combination of the information from the two channels can provide both the shape and size information.

To determine the depth of the hole, coherent illumination at normal incidence can be used and the interferences between the bottom reflection and the surrounding region of the hole can be measured. Combining absolute measurements of certain parameters, (e.g. hole dimensions such as depth, diameter, etc.) with relative measurements of the full hole cross-section (e.g. determination of the shape/geometry/profile, etc. of the hole), enables providing of the full cross-section measurement in absolute terms.

Moreover, phase measurement of the reflection can provide additional information on the hole profile (e.g. depth profile). This can be performed by splitting off a part of the incident beam prior to the interaction with the sample and causing interference of the split-off incident beam with the reflected beam. The split-off beam could be expanded in order to cover the whole detector light sensitive surface and thus produce phase sensitive intensity measurements.

For all types of light sources, a calibration procedure might to be performed to characterize the light pattern collected on the detector when reflected from a known reflectivity sample such as a single-crystal silicon wafer. This calibration can be performed on a periodic basis depending on the stability of the illumination system source and the optical system construction.

Figure 3:
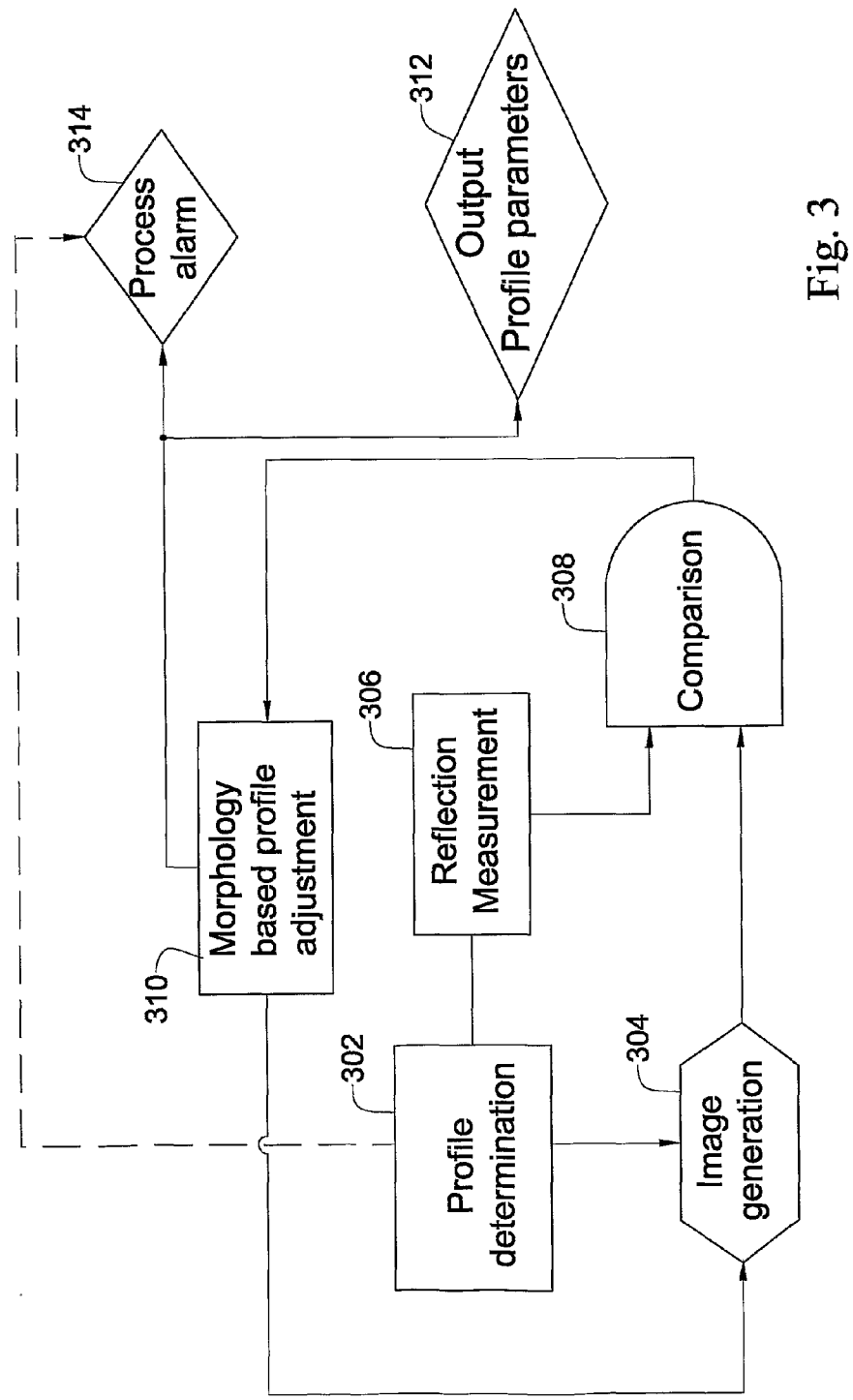
FIG. 3 schematically represents a flowchart of the measurement analysis according to the teachings of the present invention.
Figures 4A, 4B, 4C, 4D:
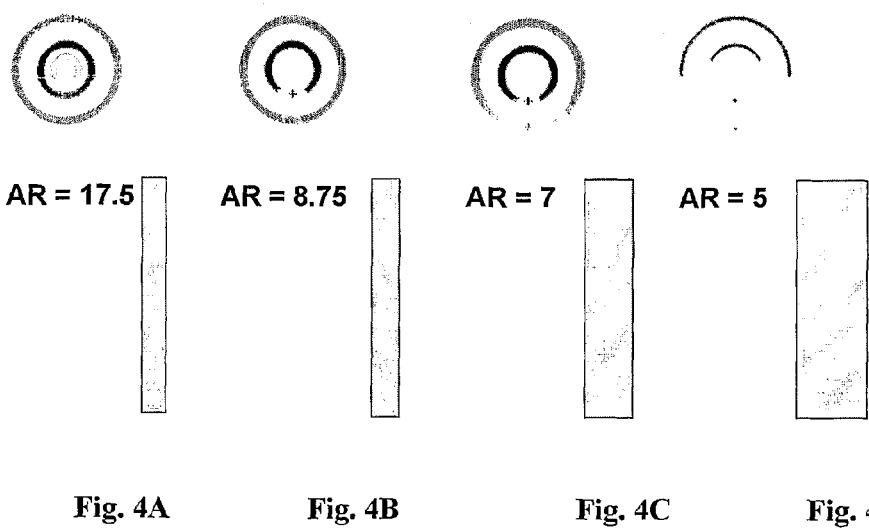
FIGS. 4A-4D represent simulated reflected patterns from cylindrical holes having different aspect-ratios.

Reference is made to FIG. 3 illustrating a general flowchart of the technique of the present invention. According to the teachings of the present invention, in step 302, a control system connected to the detection system comprises inter alia a data processing utility configured to determine data representative of an initial hypothetical profile of at least one via-hole, characterized by a finite set of parameters. The initial theoretical (e.g. hypothetical) profile is stored in a memory utility. In step 304, the data processing utility generates a theoretical model image using the theoretical profile. In step 306, a measurement image of at least one hole profile is captured by a detection system and is compared to the model image in 308 by the data analyzing utility. A predefined metric 310 (i.e. profile adjustment of the general morphology of the images) is used to quantify the quality of the correlation between the model and measurement images. If the fit between the images is not within a predefined range, a new profile (i.e. a new set of parameters) is generated based on the difference between the images and the known dependence of the profile on the parameters. Once a fit is achieved, the parameters of the relevant theoretical model are considered as the output of the optical system as illustrated in 312 and this information is provided to the user for controlling the process of the hole formation.

If the analysis is carried out as part of an ongoing measurement flow, the initial theoretical profile can be based on the output result of a previous measurement. This can reduce the number of iterations required to obtain the desired fit.

The generation of a set of parameters can be based on analyzing the general morphology of the measured image. The morphological characteristics of the measured image can be selected from at least one of the following: the symmetry of image in relation to the incidence angle(s); the narrow-angle spread of reflection angles around the incident angle indicative of side-wall angles, the number of rings in the reflected image which is indicative of the aspect-ratio of the hole, the portion of the reflected light pattern at relatively high angles which is indicative of a slight bottom rounding, the reduced or hazy light pattern as indicator of surface roughness and others.

In some embodiments, multiple measured images are obtained, for example from multiple incidence angles of light sources. The multiple measured images induce the creation of a corresponding multiplicity of model images generated from the theoretical profile and a comparison metric is defined accordingly. The fit is then carried out in parallel for all the images.

It should be noted that the image produced from the theoretical profile can be based on geometrical ray tracing calculations or diffraction based calculations based on physical optics or on a combination of both. In order to reduce the calculation time, a series of theoretical profiles can be pre-calculated and stored in the memory utility. The profiles can be generated on the basis of a theoretical range of process conditions or based on characterization of actual samples. The theoretical range of process conditions can be the input of the control system, together with the parameters of measurement conditions of the optical system. The control system thus provides a range of possible theoretical profiles. These theoretical profiles are subsequently used to generate images and the images are stored in a database as illustrated in the figure.

The calculation time can also be reduced by recognizing morphological characteristics of the image (i.e. pattern recognition) and segmenting the image into specific profile families. The segmentation can be performed using at least one the morphological characteristic.

These morphological characteristics can also be used to recognize process excursions, e.g. reduced intensity of the light pattern in the image could be an indicator of enhanced scalloping formed for example by a Bosch-type etching process. A process alarm illustrated in 314 can be raised based on such a parameter.

An adaptive mode of measurement can be implemented, especially when the analyzing of samples of unknown hole profile is performed. In this adaptive mode of measurement the illumination system parameters are varied while successively capturing measurement images until a sharp image with strongly recognizable features is found. The parameters which can be varied include, but are not limited to: angle of incidence, rotation angle, wavelength, divergence angle. The recognizable features include, but are not limited to: underfilled rings, spots, high-angle signal rings, rings with cusps, bands dependent on the number of sidewall reflections.

Reference is made to FIGS. 4A-4D illustrating modeled reflected patterns from cylindrical holes having different aspect-ratios. The reflection effects caused by various parameters can be separated. For a substantially cylindrical hole with a flat bottom, the number of reflections via sidewalls and via the bottom is a direct function of the incidence angle and the aspect ratio. The number of the rings in the reflected image is indicative of the aspect-ratio of the hole. The larger the number of the rings is, the larger the aspect-ratio of the holes. Moreover, the tangential filling of rings increases with additional multiple reflections. The larger the incidence angle is, the more homogeneous the filling of the rings.

Figures 5A, 5B, 5C:
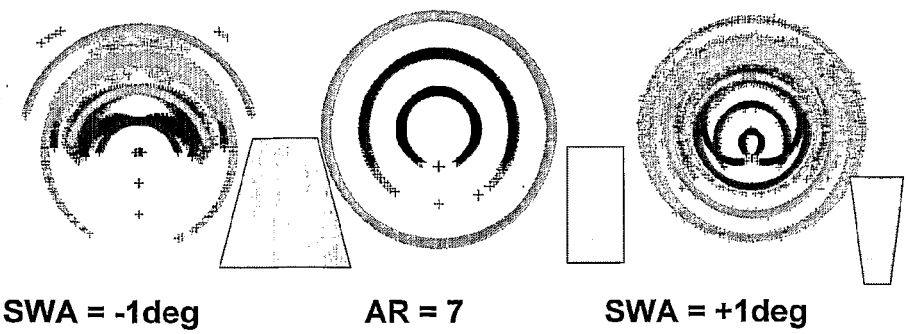
FIGS. 5A-5C represents simulated reflected patterns from conic holes having different sidewall angles.

Reference is made to FIGS. 5A-5C illustrating modeled reflected patterns from conic holes having different sidewall angles (SWA). It has been observed that the reflected patterns vary differently when the hole has a non-perpendicular sidewall angle (SWA). For positive slopes, the rings begin to fold onto themselves as the SWA increases and cusps i.e. singular points appear. Increasing the SWA and/or incidence angle causes the cusps to split into multiple rings. For negative (re-entrant) slopes, the rings shorten and start to turn outwards into wing-like shapes. At higher aspect ratios and/or incidence angles, multiple reflections between the walls fill the rings and form double rings.

Figure 6A:
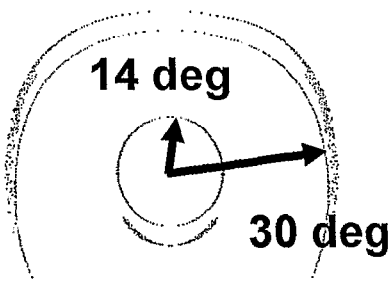
FIGS. 6A-6C represent a cylindrical hole having a partially rounded bottom and simulated reflected patterns therefrom for rays reflected at large incident angles (in the range of about 14-30°) and at small incident angles (about 2°)
Figure 6B:
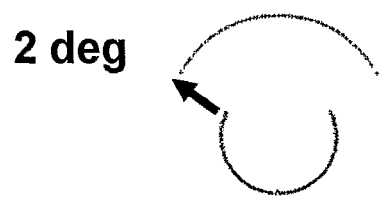
Figure 6C:
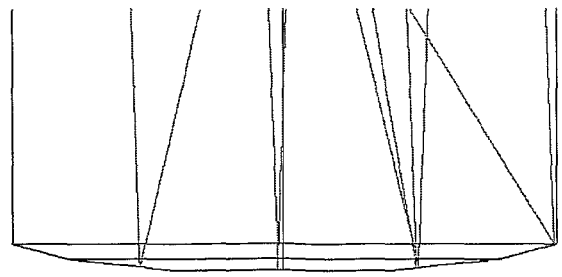

Bottom rounding, due to its more varied angle content, causes rays to reflect in a much larger angle range than a flat bottom. The larger the area of non-flat bottom (e.g. bottom rounding), the larger the percentage of rays reflected out of the above described rings. The rays are reflected into a range of angles of order tens of degrees. The full reflection angular range can be analyzed or the reduced angular range image of the main sidewall and bottom reflections can be analyzed separately. Reference is made to FIGS. 6A-6C in which the incidence angle is 2 degrees from normal on an aspect ratio (AR) of 14 and +1 degree SWA. FIG. 6A shows a wide angular range (about 14-30°) of reflection caused by the rounding at the outer edges of the bottom. FIG. 6B shows the reflection from the flat portion of the bottom into small angles (2°), where the partial filling of the rings is due to the portion of rays reflected out to higher angles. As illustrated in FIG. 6C, the bottom rounding covers more than a half of the bottom area.

Figure 7A:
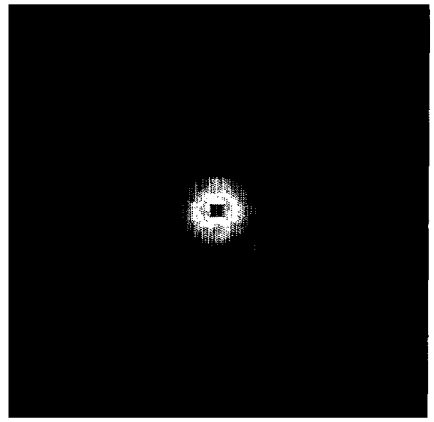
FIGS. 7A-7F represent simulated reflected patterns from a slightly conic hole and mask layer illustrated in FIG. 7E with different bottom rounding radius.
Figure 7B:
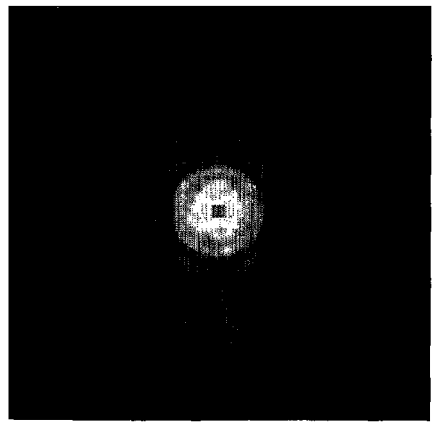
Figure 7C:
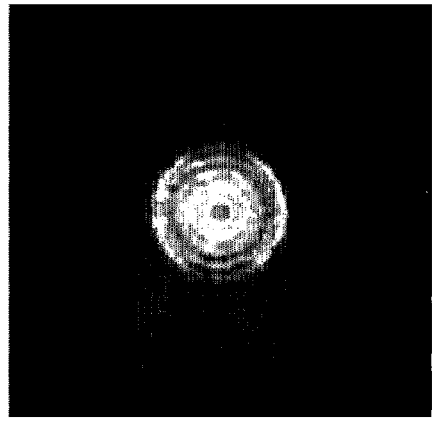
Figure 7D:
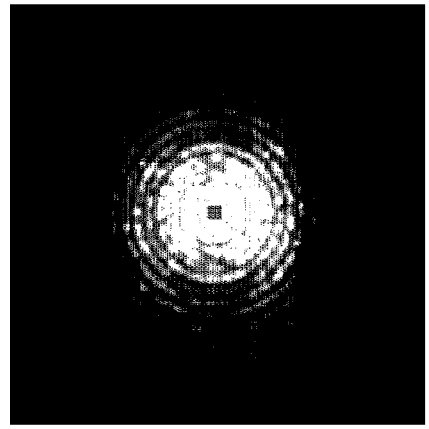
Figure 7E:
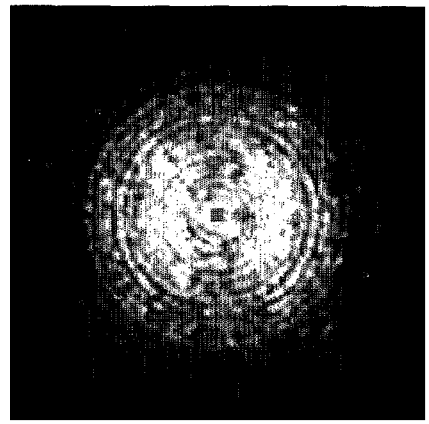
Figure 7F:
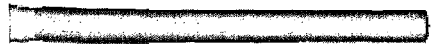

Reference is made to FIGS. 7A-7E illustrating different reflections patterns for a slightly conic hole (illustrated in FIG. 7F) coated with a mask layer and having different bottom radius varying from 9 microns to 2 microns (FIG. 7A has bottom radius of 9 microns, FIG. 7B of 7 microns, FIG. 7C of 5 microns, FIG. 7D of 3 microns, FIG. 7E of 2 microns). In this specific example, the depth of the hole is 30 microns, the top diameter 2.7 microns, the bottom diameter 2.5 microns, and the mask thickness 2 microns. It should be noted that the integration time increases with the decreasing of the bottom radius. For a nominal integration time of N in FIG. 7A, in FIG. 7B the time integration is 1.5N, in FIG. 7C 3N, in FIG. 7D 6N, and in FIG. 7E 11N. When the bottom of the hole is rounded, normal incidence light can be used. The light reflected from the rounded bottom spreads into a two-dimensional fan emanating from the bottom of the hole, which can probe the sidewalls. The number of sidewall reflections depends on the radius of the bottom rounding and on the aspect ratio of the hole profile. Any sidewall slope induces a change of angle of the reflected fan and the resultant measured image contains bands dependent on the number of sidewall slope reflections. Therefore, the reflected light pattern collected on the detector, is spread out over a larger spatial range. These reflections can also probe re-entrant sidewall profile. Due to the increasing spread of angles coupled to shrinking of the bottom radius, an increased measurement integration time or increased light source intensity are required because of the loss caused by the multiple reflections. It should be understood that in comparison with flat bottom hole, for holes having a rounded bottom each ray undergoes a larger number of reflections inside the hole and that the angles of incidence on the sidewalls are lower than for a flat bottom.

The separation of effects due to the bottom rounding from those due to the sidewall slopes can be achieved by fitting the image to an image based on a theoretical model. If the parameter separation is difficult, measurements can be carried out at additional angles of incidence.

It should be noted that the reflected light beam from the sample surface outside the hole, which is essentially the specular reflection, is much stronger and more spatially concentrated than the reflected light beam from the hole. Moreover, the reflected light beam signal from the hole is much stronger and more spatially concentrated than the scattered light beam signal from the hole. A large dynamic range is therefore required from the detector to enable capture and measurement of all the reflected information simultaneously. Additionally, it can be useful to insert a spatial filter (e.g. mask) into the reflected beam that blocks only the region of the specular beam to eliminate the specular reflection or the region of the near-axis specular beam to eliminate the scattered light beam signal, reflected from flat areas outside the hole, thus enabling sufficient detector integration time without suffering from saturation of the reflected beam. If the weaker high angle reflections and scatter need to be analyzed, it is possible to block the near-axis reflections e.g. by providing appropriate blocking aperture stop.

In order to filter out the light reflected from the flat areas outside the hole, it is also possible to polarize the incident light and to provide a polarizer rotated at 90 degrees in the path to the detector. This can reduce the dynamic range required from the detector. The light collected by the detector will then only be skew rays undergoing reflections in the hole, having a direction out of the polarized plane of incidence.

It should be noted that if the hole has a non-flat bottom, the reflected light pattern becomes more complex owing to the continuous gradient of the reflection angle at the bottom. Then, the image has to be collected and analyzed with a large dynamic range, blocking the specular reflection from outside the hole. Therefore, for non-flat bottom hole, larger detector integration times or higher intensity incident light are then required.

Figures 8A, 8B, 8C:
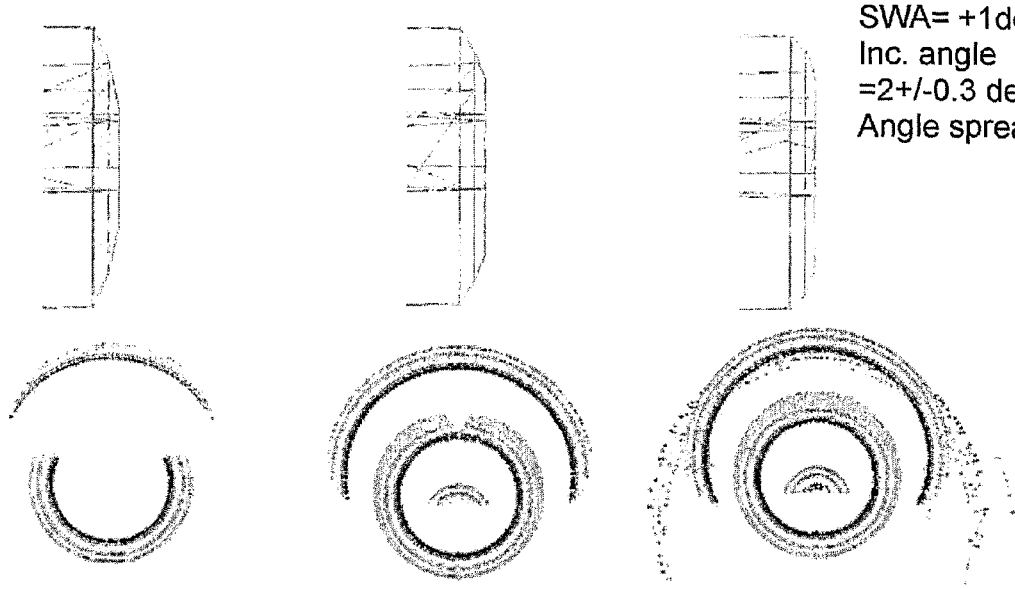
FIGS. 8A-8C represent simulated reflected patterns from slightly conic holes with different portions of flat bottom.

Reference is made to FIG. 8 illustrating reflected patterns from slightly conic holes having different portions of flat bottom. As it can be observed from the figure, when the portion of flat bottom area increases, the rings are filled out. An angular spread of +/−0.3 degrees has been added to the 2 degrees of normal incidence light.

It should be noted that the shape of the hole opening is usually circular but the present invention can be used to characterize profiles of holes with various openings including square, elliptical, square with rounded corners as well as holes with a square opening tapering into a circle or rounded square at the bottom.

Moreover, due to the shallow incidence angle on the sidewalls, the reflected light from the hole can be at least partially polarized. Intentionally polarizing the incident light beam can enable extraction of ellipsometric effects of the sidewall reflections. The ellipsometric effects can be utilized for measurement of coatings on the sidewalls including both transparent and thin metallic coatings. The absorption of multiple reflections on the sidewalls by the substrate or coating materials causes a stepwise reduction of the intensity of some of the reflected light pattern depending on the number of reflections the rays undergo. This stepwise reduction of intensity is an additional parameter that can be modeled and used for obtaining information on the hole profile.

It should be noted that relatively small sharp features within the hole add diffraction effects to the reflected light pattern. This can affect the required angular divergence of the incident beam. Scanning the incident beam angle can enable more detailed sensing of such diffraction effects and determination of their size and location within the cross-section.

Figure 9:
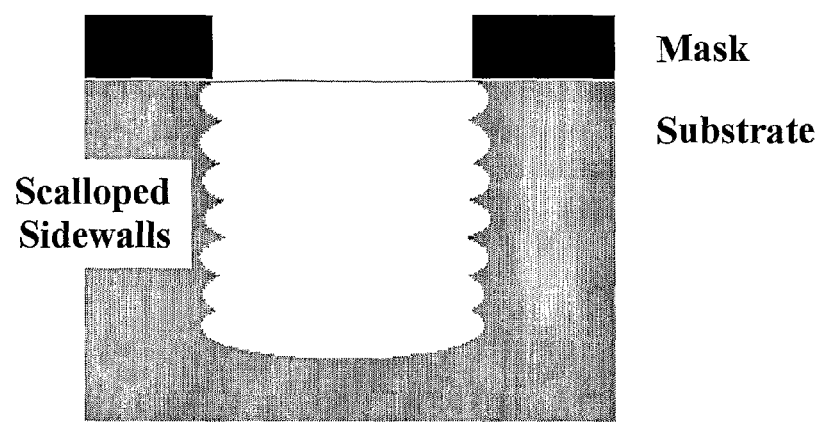
FIG. 9 schematically represents a typical cross-section of hole with scalloping.

Increased background noise and loss of light patterns intensity or contrast are due to scattering induced by roughness of the sidewalls and of the bottom of the hole. Due to the fact that the scattered beam emanates, at least partially, from the bottom of the hole, the intensity of the scattered beam is higher close to the vertical axis of the hole. Therefore, the spatial profile of the scattered beam contains information on the shape of the hole opening and the aspect-ratio. It should be noted that certain techniques typically used for the formation of the etched holes can cause systematic sidewall roughness, e.g. scalloping caused by the well known Bosch etch process as illustrated in FIG. 9. The depth and pitch of the scalloping can be analyzed by varying the wavelength of the incident light beam. Wavelengths longer than the scalloping cycle will be less affected by this effect.

For small hole-openings in the range of the wavelength dimension, the reflected light pattern contains diffraction effects. The theoretical model is then based on the convolution of the geometrical reflection from the sample surface outside the hole with the diffracted light from the shape of a single hole-opening. A light beam having large lateral coherence relative to the diameter of the hole can be used and a far field pattern of the reflection from the region of hole-opening can be analyzed to obtain the absolute size. If the holes are arranged in dense periodic array, additional diffraction effects could appear depending on the effective lateral coherence length. The diffraction image can be analyzed and the absolute size of the hole-opening can be obtained based on the knowledge of geometry of the system and the wavelength of the light beam.

Figure 10:
FIG. 10 represents simulated reflected patterns from a hole having a square opening and a rounded bottom.

Reference is made to FIG. 10 illustrating the reflection from a hole having an intermediate shape, e.g. a square hole with rounded corners. As it can be observed from the figure, the reflected pattern comprises a combination of spots and partial rings. For a hole having a substantially rectangular shaped opening and flat walls, the reflection retains the spot shape and no spreading into rings occurs. This is the case also for sloped flat walls. The number and location of spots depends on the aspect ratio, sidewall slope and incident angle.

The invention claimed is:

1. An optical system for determining one or more parameters of at least one via-hole in an structure, the optical system comprising:
   an illumination system for producing at least one light beam and directing it on a sample in a region of the structure containing at least one via-hole;
   a detection system configured and operable to collect a pattern of light reflected from the illuminated region, the light pattern being indicative of one or more parameters of said via-hole; and,
   a control system connected to the detection system, the control system comprising
      a memory utility for storing a predetermined theoretical model comprising data representative of a set of parameters describing via-holes reflected pattern,
      an image generation utility configured and operable to generate model images using said predetermined theoretical model, and
      a data processing and analyzing utility configured and operable to
         receive and analyze an image received from said detection system and being indicative of the detected light pattern and the generated model image,
         fit the received image to the generated model image, and
         determine one or more parameters of said via-hole from the set of parameters of the theoretical model that corresponds to the model image with a predefined fitting range.

2. The system of claim 1, wherein said detection system comprises a light sensitive surface located in a far-field relation or in a Fourier relation with respect to a sample surface.

3. The system of claim 1, wherein said illumination system comprises a plurality of light sources.

4. The system of claim 3, wherein said light sources emit at different angles of incidence on a sample surface, said detection system collecting a plurality of light patterns corresponding to different angular positions.

5. The system of claim 3, wherein at least two of said plurality of light sources produce light beams at different wavelengths.

6. The system of claim 1, wherein the illumination system comprises a light source associated with an aperture configured to shape the angle incident on a sample surface.

7. The system of claim 1, wherein the illumination system comprises an array of LEDs or lasers.

8. The system of claim 7, wherein the illumination system comprises an objective lens configured to focus a plurality of beams on the sample, said array being located in the back-focal plane of said objective lens, said back-focal plane having a Fourier relation or a far field relation with the sample surface plane.

9. The system of claim 8, wherein said array is imaged to a plane having a Fourier relationship or far field relationship with the sample surface plane.

10. The system of claim 7, wherein said array is located at a plane having a Fourier relationship or far field relationship with the sample surface plane.

11. The system of claim 7, wherein said array is arranged in a grid-like pattern.

12. The system of claim 1, wherein said one or more parameters of said via-holes are selected from the followings: geometrical profile, cross-section profile, depth, width, slope, undercut, hole opening shape, aspect-ratio, sidewall slope, sidewall slope variation, bottom rounding, surface roughness, surface absorption, surface coating of said via-holes.

13. The system of claim 1, configured and operable for determining parameters of multiple holes distributed in a sample in arbitrary locations or in a repetitive array arrangement.

14. The system of claim 1, wherein said detection system comprises a lens configured to collect the pattern of the reflected light and to image said pattern onto said detector.

15. The system of claim 1, comprising at least one of polarizer or spatial filter configured to block a portion of the light pattern reflected from the region surrounding said via-hole.

16. A method for determining parameters of at least one via-hole comprising:
   providing data indicative of an initial theoretical profile of at least one via-hole having a set of parameters and a model image based on said theoretical profile, wherein said set of parameters describe one or more reflected patterns of via-holes corresponding to one or more morphological characteristics of an image of a sample to be analyzed;
   illuminating a region of a sample containing at least one via-hole;
   collecting a pattern of light reflected from said region and being indicative of one or more parameters of said via-hole;
   receiving an image data indicative of the collected light pattern;
   fitting said image data to said model image; and
   determining at least one parameter of said via-hole in said sample from the set of parameters of the theoretical profile corresponding to the model image upon achieving a predefined fitting range,
      wherein any of said providing, illuminating, collecting, receiving, comparing, and determining steps are performed by any of a machine, a computer, processor, or controller.

17. The method of claim 16, comprising determining a degree of correlation between said image data indicative of the detected light pattern and said model image and when said degree of correlation is beyond a predefined range, generating a new set of parameters based on the differences between the images.

18. The method of claim 16, comprising varying at least one illuminating parameter and collecting a plurality of patterns of reflected light corresponding to said variation and comparing each image data indicative of the detected light patterns with a corresponding model image.

19. The method of claim 18, wherein said at least illumination parameter is selected from the following: angle of incidence of a light beam on the sample surface, wavelength of incident light beam, divergence angle of incident light beam, rotation angle between an illumination source illuminating said region of the sample and the sample surface, polarization of the incident light beam.

20. The method of claim 19, comprising varying the angle of incidence of the light beam on the sample surface and detecting the reflected light pattern as function of different incident angles, being indicative of the morphology of the shape of the hole.

21. The method of claim 20, wherein said morphological characteristics are selected from symmetry of the image in relation to at least one incidence angle, narrow-angle spread of reflection angles around the incident angle indicative of side-wall angles, number of rings in the reflected pattern of light indicative of the aspect ratio of the hole, portion of the reflected pattern of light at high angles indicative of a slight bottom rounding, reduced or hazy light pattern as indicator of surface roughness.

22. The method of claim 19, comprising varying the divergence angle of incident light beam and detecting the reflected light pattern as a function of different divergence angles, and varying the resolution of the reflected light patterns and the accuracy of the parameters of said via-holes.

23. The method of claim 19, comprising varying the wavelength of incident light beam and detecting the reflected light pattern as a function of different wavelengths, being indicative of the depth and the pitch of scalloping profile of the walls' hole.

24. The method of claim 16, wherein the parameters of the theoretical profile are selected from at least one of the following parameters: hole opening shape, aspect-ratio, sidewall slope, sidewall slope variation, bottom rounding, surface roughness, surface absorption, surface coating.

25. The method of claim 16, comprising rotating the plane of incidence of the light beam in relation with the plane of the sample surface by rotating at least one of a sample, a light source and an aperture located in front of said light source and a polarizer.

26. The method of claim 16, comprising characterizing a thickness distribution and geometrical profile of a coating layer deposited in said via-hole by performing measurements before and after depositing the coating, and by analyzing the differences between the measurements.

27. The method of claim 16, comprising segmenting said image data indicative of the detected light pattern into different profiles using the morphological characteristics of said image.

28. The method of claim 16, comprising collecting a pattern of light scattered from said region and analyzing an image data indicative of the scattered light pattern indicative of the shape and the aspect ratio of the holes.

* * * * *